US007157936B2

(12) United States Patent
Chauhan et al.

(10) Patent No.: US 7,157,936 B2
(45) Date of Patent: Jan. 2, 2007

(54) UTILIZATION OF UNUSED IO BLOCK FOR CORE LOGIC FUNCTIONS

(75) Inventors: Rajat Chauhan, Idgha (IN); Rajesh Kaushik, Haryana (IN)

(73) Assignee: STMicroelectronics Pvt. Ltd. (IN)

( * ) Notice: Subject to any disclaimer, the term of this patent is extended or adjusted under 35 U.S.C. 154(b) by 0 days.

(21) Appl. No.: 10/347,139

(22) Filed: Jan. 17, 2003

(65) Prior Publication Data

US 2003/0172363 A1    Sep. 11, 2003

(30) Foreign Application Priority Data

Jan. 17, 2002    (IN) ............................. 35/DEL/2002

(51) Int. Cl.
*H01L 25/00* (2006.01)
(52) U.S. Cl. .............................. 326/41; 326/38; 326/39; 326/40
(58) Field of Classification Search ............ 326/36–41
See application file for complete search history.

(56) References Cited

U.S. PATENT DOCUMENTS

| 5,381,058 | A   | * | 1/1995  | Britton et al. ................. 326/41 |
| 5,825,202 | A   | * | 10/1998 | Tavana et al. ................. 326/39 |
| 5,869,982 | A   | * | 2/1999  | Graf ............................. 326/40 |
| 6,348,813 | B1  | * | 2/2002  | Agrawal et al. .............. 326/41 |
| 6,353,331 | B1  | * | 3/2002  | Shimanek ..................... 326/39 |
| 6,480,025 | B1  | * | 11/2002 | Altaf ............................ 326/39 |
| 6,518,787 | B1  | * | 2/2003  | Allegrucci et al. ........... 326/38 |
| 6,703,860 | B1  | * | 3/2004  | Agrawal et al. .............. 326/41 |
| 6,774,670 | B1  | * | 8/2004  | Feng et al. ................... 326/41 |
| 6,842,039 | B1  | * | 1/2005  | Guzman et al. .............. 326/38 |
| 2001/0028257 | A1 | * | 10/2001 | Kaptanoglu .................. 326/41 |
| 2004/0155676 | A1 | * | 8/2004  | Kaptanoglu et al. .......... 326/38 |

OTHER PUBLICATIONS

Xilinx's data book of year 1999 (Virtex device IOB on p. 3-6).

* cited by examiner

*Primary Examiner*—Linh Nguyen
(74) *Attorney, Agent, or Firm*—Lisa K. Jorgenson; J. Mark Han; Graybeal Jackson Haley LLP

(57) ABSTRACT

A method and an improved FPGA apparatus for enabling the selective deployment of unused flip-flops or other circuit elements in IO cells and unused decoders or other circuit elements in Look Up Tables (LUT), for core logic functions is provided, comprising disconnecting means for selectively disconnecting unused circuit elements from the IO pad circuitry or from said LUT circuitry, and connecting means for selectively connecting said disconnected circuit elements either to the connection matrix of the core logic or between themselves to provide independently configured functions.

50 Claims, 8 Drawing Sheets

UTILIZATION OF UNUSED IO BLOCK FOR CORE LOGIC FUNCTIONS

PRIORITY CLAIM

This application claims priority from Indian patent application No. 35/Del/2002, filed Jan. 17, 2002, which is incorporated herein by reference.

TECHNICAL FIELD

This invention relates generally to a system and method for enabling the utilization of unused IO Block and Look Up Table (LUT) circuitry for core logic functions or independent logic functions.

BACKGROUND

In many FPGA applications it is required to provide the option for registering the incoming and outgoing signals to and from the FPGA. For this purpose IO cells are usually designed to include flip-flops. A flip-flop is provided with the output buffer to register the signal coming from the core, before going to the IO pad, and with the input buffer to register the signal coming from the pad, before going to the core. Sometimes the tri-stating signal of the output buffer is also provided with a flip-flop for synchronization. These IO Blocks (IOB) include the option to use these flip-flops or to bypass them depending upon the type of application. This is described in, e.g., *Xilinx's data book of year* 1999 (*Virtex device IOB* on page 3–6), which is incorporated by reference.

In applications where registered inputs-outputs are not required, there is direct signaling between IO pads and core and the flip-flops are left unutilized. It is also possible that some of IOs of the FPGA device are not used, and in this case flip-flops associated with these IOs are also not utilized. With minimal addition of hardware, these flip-flops can be utilized for some other purpose thereby reducing the load on internal core Logic cells.

U.S. Pat. No. 5,869,982, which is incorporated by reference describes an apparatus and method for interconnecting adjacent unused IO pad circuitry to provide independent logic function. The invention described in the '982 patent does not, however, provide for the connection of such unused circuitry to the core logic, nor does it utilize the unused circuit elements of the Look Up Tables.

SUMMARY

In one embodiment of this invention, an apparatus and method are provided for enabling the utilization of unused IO pad and LUT circuitry for core logic functions or for implementing independent logic functions.

To achieve this in an FPGA apparatus, an improvement is provided for enabling the selective utilization of unused flip-flops or other circuit elements in IO cells and unused decoders or other circuit elements in Look Up Tables (LUT), for core logic functions, comprising:

disconnecting means for selectively disconnecting unused circuit elements from the IO pad circuitry or from said LUT circuitry, and connecting means for selectively connecting said disconnected circuit elements either to the connection matrix of the core logic or between themselves to provide independently configured functions.

The disconnecting means is Configuration Logic circuitry provided between the internal core logic and IO pad interface circuits or LUTs.

The connecting means is a routing matrix between internal core logic and said IO pad circuitry or LUT circuitry.

The unused IO pad flip-flops are configured as serial-to-parallel or parallel-to-serial data converters.

The unused LUT circuit elements are deployed to implement configurable two or four input logic functions.

The logic function is a multiplexer function.

The above FPGA apparatus includes grouping of said IO pads for enabling configurable complex logic functions.

The embodiment of the present invention further provides a method for enabling the utilization of unused flip-flops or other unused circuit elements in IO cells and unused decoders or other circuit elements in Look Up Tables (LUTs) of an FPGA for core logic functions, comprising the steps of:

disconnecting said unused circuit elements from said IO circuitry and/or LUT, and connecting said disconnected circuit elements to the connection matrix of the core logic or amongst themselves to provide independent functions.

The disconnecting is done by Output Configuration Logic circuitry provided between the core logic and IO pad interface (IOL) circuits or LUT.

The connecting is done by a routing matrix between interval core logic and said IO pad circuitry or LUT circuitry.

The method is used for configuring said unused IO pads flip-flops as parallel-to-serial or serial-to-parallel data converter.

The unused LUT circuit elements are deployed to implement configurable two or four input logic functions.

The logic function is a multiplexer function.

The above method includes grouping of said IO pads for enabling configurable complex logic functions.

BRIEF DESCRIPTION OF THE DRAWINGS

Embodiments of the invention will now be described with reference to the accompanying drawings.

DETAILED DESCRIPTION

Figure 1:
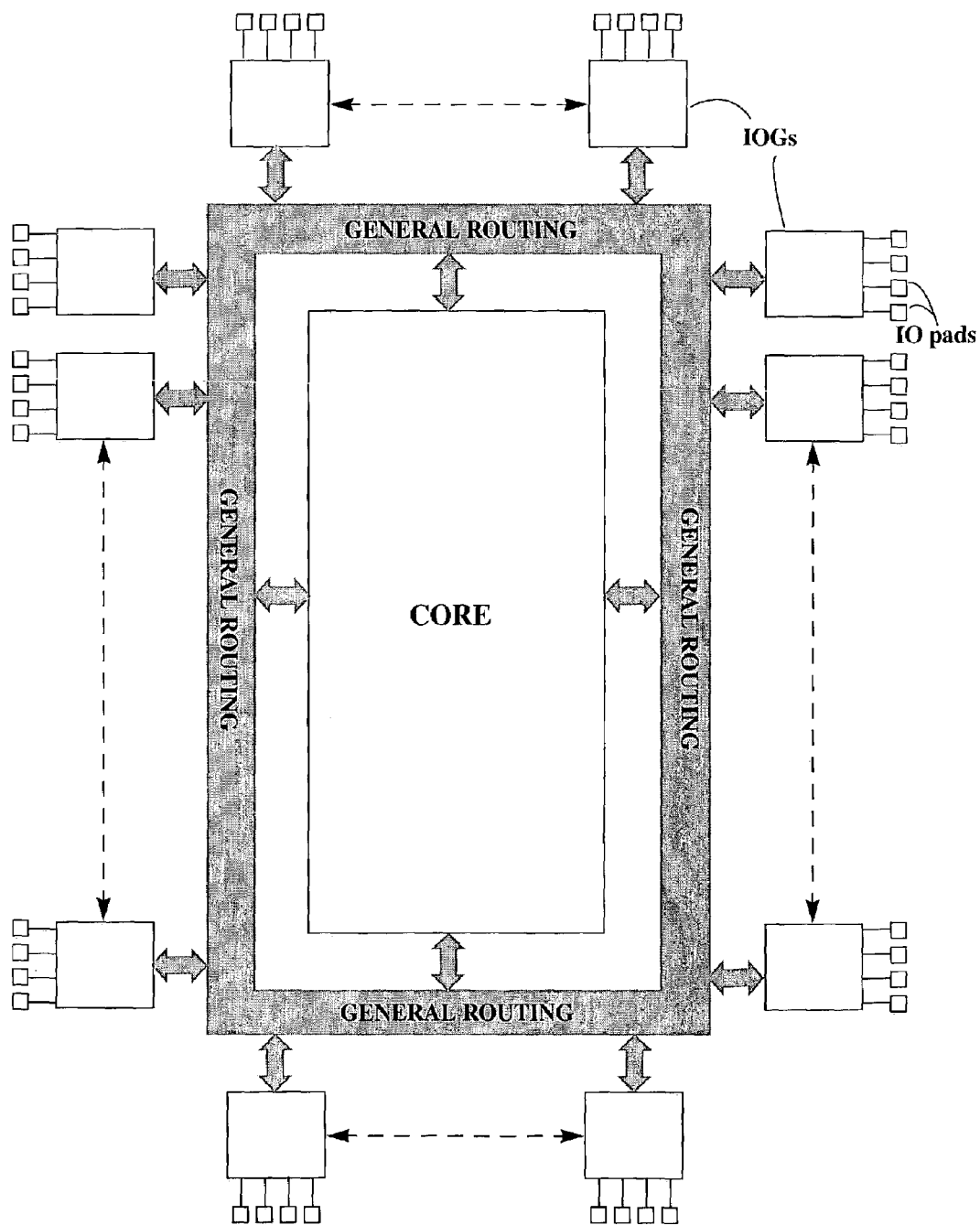
FIG. 1 shows the top level structure of an FPGA according to an embodiment of this invention.

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention as defined by the appended claims. Thus, the present invention is not intended to be limited to the embodiments shown, but is to be accorded the widest scope consistent with the principles and features disclosed herein.

An improved FPGA in which each IO pad has associated with it an IOI (input output interface) and an IOL (input output logic) is described according to an embodiment of the invention. IOIs comprise of input and output buffers for interfacing with the external world and IOLs have flip-flops and muxes for providing registered, latched, unregistered and other logical options to IO signals. Each IOL has four flip-flops, one for input data, one for output data and two for output buffer tri-state signals. Hence the IOL forms the link between the IOI and the core. IOLs of four consecutive pads are grouped to form an IOLG (input output logic group) and the corresponding four IOIs are grouped to form an IOIG (input output interface group). Thus, as each IOL has 4 flip-flops, each IOLG will have 4*4=16 flip-flops. An IOLG and a corresponding IOIG are grouped to form an IOG(input output group). So each IOG groups four IO pads, four IOIs and four IOLs. A 4-input LUT decoder circuit is also associated with each IOLG.

Apart from the normal use of flip-flops to register input/output signals in an IOG, if not used for this purpose these flip-flops can be used for a 4-input LUT, or Serial-to-Parallel and Parallel-to Serial data converter. In the case when all the four IOs in an IOG are used in direct mode or are unused, the unused 16 flip-flops in an IOLG can be configured as transparent latches and along with an LUT decoder, can be used as a 4-input LUT for logic implementation. This will reduce the load on internal core Logic cells. This four input LUT can have its inputs either from the routing matrix or directly from the four input buffers of the same IOG to which it is associated. The output of the LUT can also be configured to go to the routing matrix or directly to any one of the output buffer of the same IOG. This option to connect input/output of LUT directly to the IO pads reduces the delays, which would otherwise be going via routing matrix to the internal logic cells for the same purpose.

In the case when four or less than four of the IOs of an IOG are used in direct mode or are unused, the unused flip-flops of the IOLG can be used as a Serial-to-Parallel or Parallel-to Serial data converter. If flip-flops of only one IOL in an IOLG are free, then a 4-bit Serial-to-Parallel or Parallel-to Serial data converter can be implemented using these four flip-flops. Similarly if two IOLs of an IOLG have their flip-flops free, than an 8-bit Serial-to-Parallel or Parallel-to Serial data converter can be implemented. If only three IOLs are free then 12-bit, and if all the four IOLs are free then 16-bit converters can be implemented. Data converters higher than 16-bit can be implemented using IOLs of adjacent IOGs. Serial-to-Parallel or Parallel-to Serial data converters can be core-to-core (i.e. serial input coming from core and parallel output going back to core or parallel input coming from core and serial output going back to core), pad-to-core (input from pad and output going to core) or core-to-pad (input from core and output going to pad). In case of pad-to-core only serial-to-parallel data converter (i.e. serial input from the pad and parallel output to the core) are possible and similarly in the case of core-to-pad only parallel-to-serial data converter (i.e. parallel input from the core and serial output to the pad) are possible. Other conversion operations (pad-to-core parallel-to-serial conversion, core-to-pad serial-to-parallel conversion and pad-to-pad conversions) cannot be done independently in an IOLG, as the data has to be routed via routing matrix to complete the conversion. These operations depend on the architecture of the routing matrix.

DETAILED DESCRIPTION OF A PREFERRED EMBODIMENT OF THE INVENTION

FIG. 1 gives the top level of hierarchy for the proposed architecture according to a preferred embodiment of the invention. IOs in the IO ring of an FPGA are grouped into IOGs (Input Output Groups). Each IOG groups four IOs. GENERAL ROUTING is a configurable routing matrix to provide a flexible interface between IOG-CORE and IOG-IOG.

Figure 2:
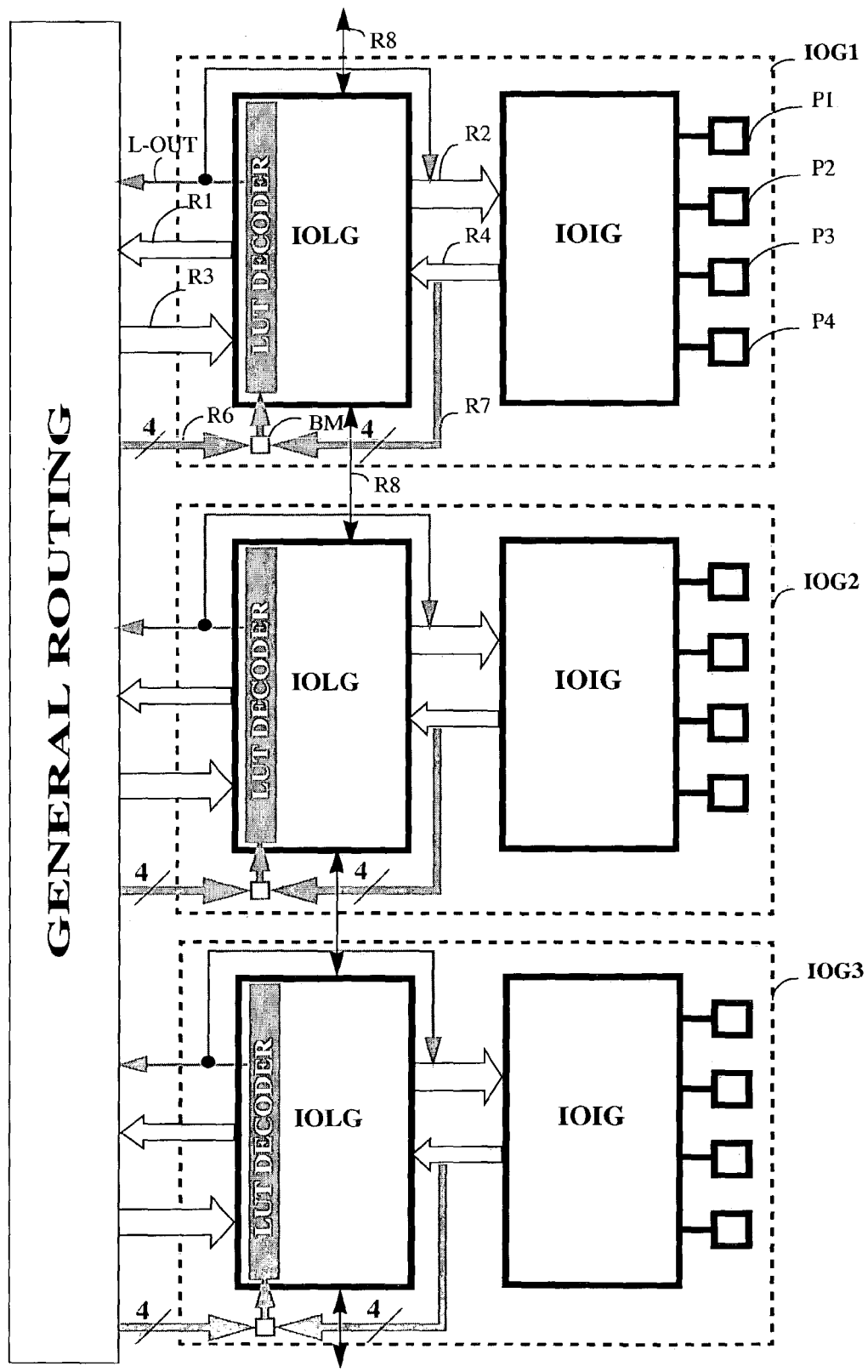
FIG. 2 shows the block diagram of an IO Group IOG according to an embodiment of the invention.

FIG. 2 shows a block diagram of IOG and its interface with routing matrix GENERAL ROUTING and adjacent IOGs. In the figure three IOGs, IOG1, IOG2 & IOG3, are shown. As all IOGs are exactly same in this embodiment, so to explain let us take IOG1. Four IO Pads P1, P2, P3, P4, an IOIG (IO Interface Group), an IOLG (IO Logic Group) and a LUT DECODER corresponds to form IOG1. Routing resources are provided to interface between different blocks of an IOG. IO pads P1, P2, P3, P4 are directly connected to IOIG. Route R2 and R4 are used to interface between IOIG and IOLG. Interfacing between IOLG and GENERAL ROUTING is done through routing R1 and R3. L-OUT is the routing line which takes output of LUT to GENERAL ROUTING and a tapping from L-OUT also goes to IOIG to provide direct LUT output at any one of the IO pads P1, P2, P3, P4. R6 routing is a 4-bit bus coming from GENERAL ROUTING and R7 routing is a 4-bit bus coming from IOIG. R6 and R7 goes to 4-bit bus multiplexer BM whose outputs act as select lines for LUT decoder (i.e. 4 input lines to the LUT). So 4 inputs to the LUT can come from the GENERAL ROUTING or directly from IO pads P1, P2, P3, P4. Route R8 is to interface between two adjacent IOLGs.

Figure 3A:
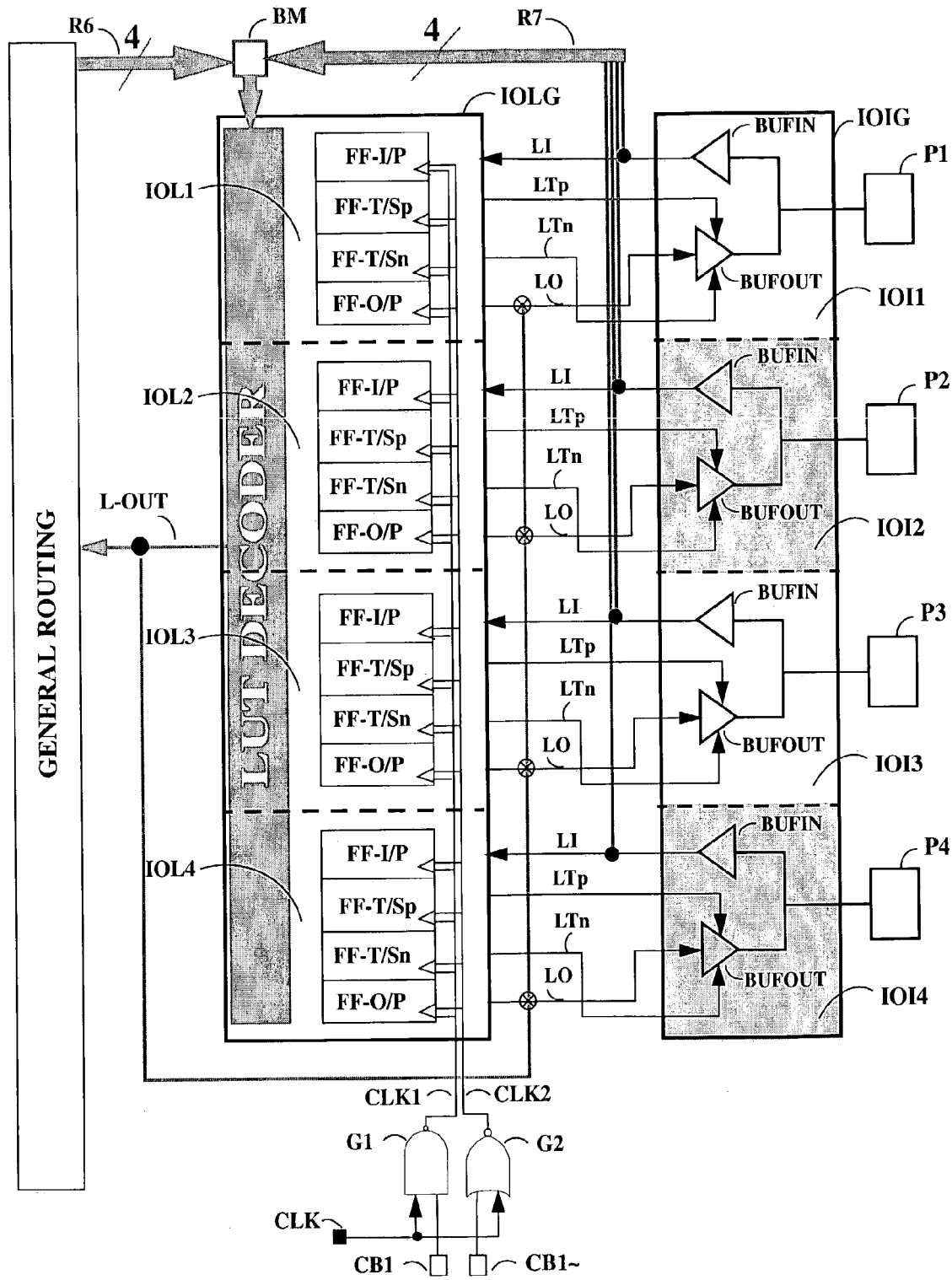
FIG. 3a) shows the internal structure of an IOG according to an embodiment of the invention.

FIG. 3(a) shows a single IOG. As each IOG being exactly same in a preferred embodiment, so to explain let us continue with IOG1. Referring to FIG. 2, IOG1 comprises of 4 IO pads P1, P2, P3, P4, an IOIG (IO Interface Group), an IOLG (IO Logic Group) and a 4-bit LUT-DECODER circuitry. IOIG is a group of 4 IOIs IOI1, IOI2, IOI, IOI each connected to its respective pad, namely P1, P2, P3, P4.

Each IOI is also linked with an IOL. So there are four IOLs IOL1, IOL2, IOL3 and IOL4, one for each respective IOI. These four IOLs are grouped to form IOLG. Each IOI has an input buffer BUFIN and an output buffer BUFFOUT. Input buffer BUFIN receives the signal from the IO pad and gives its output to IOL via line LI. Output buffer BUFOUT gets its input from IOL via line LO and its output goes to the IO pad. BUFOUT can be configured as open-drain type, open-source type, push-pull type or can be permanently tri-stated using signals LTp and LTn. Signal LTp is to tri-state pull-up transistors and LTn is to tri-state pull-down transistors of the output buffer BUFOUT.

Each IOL comprises of four flip-flops and multiplexers (not shown in this figure). Flip-flops are used to provide the register options to the IO signals. These flip-flops are named FF-I/P, FF-T/Sp, FF-T/Sn and FF-O/P, one for each of the signals linked with the corresponding IOI. For example flip-flop FF-I/P is for input signal LI, flip-flop FF-T/Sp for pull-up tri-stating signal LTp, flip-flop FF-T/Sn for pull-down tri-stating signal LTn and flip-flop FF-O/P for output signal LO.

As an IOLG has 4 IOLs and each IOL has 4 flip-flops, so we get 4*4=16 flip-flops in each IOLG. All the 16 flip-flops in an IOLG have two clock inputs, one from line CLK1 and other from line CLK2. Line CLK1 gets the clock from pin CLK through a NAND gate G1 and line CLK2 also gets the clock from pin CLK but through a NOR gate G2. The other input of NAND gate G1 is connected to configuration bit CB1 and the other input of NOR gate G2 is connected to CB1~ (inverse of CB1). For CB1 equal to zero, all flip-flops behave as transparent latches and for CB1 equal to one, they work as flip-flops, getting clock from pin CLK. The need and connectivity of two clock lines CLK1 and CLK2 within a flip-flop is explained in FIG. 3(b).

An IOLG also includes a LUT-DECODER. This LUT-DECODER is simply a 16 to 1 multiplexer and along with the 16 flip-flops of an IOLG forms a 4-input LUT. When used in an LUT, all the 16 flip-flops are loaded with required data for logic implementation and their outputs goes to the LUT-DECODER (not shown in this figure). The four inputs to the LUT can be either from the GENERAL ROUTING via route R6 or directly from four IO pads P1, P2, P3, P4 of parent IOG via route R7. Route R6 or route R7 can be selected as 4-inputs to the LUT using bus multiplexer BM. Similarly the output of the LUT can go to the GENERAL ROUTING via route L-OUT or to any one of the IO pads P1, P2, P3, P4 of parent IOG (shown in FIG. 4).

Figure 3B:
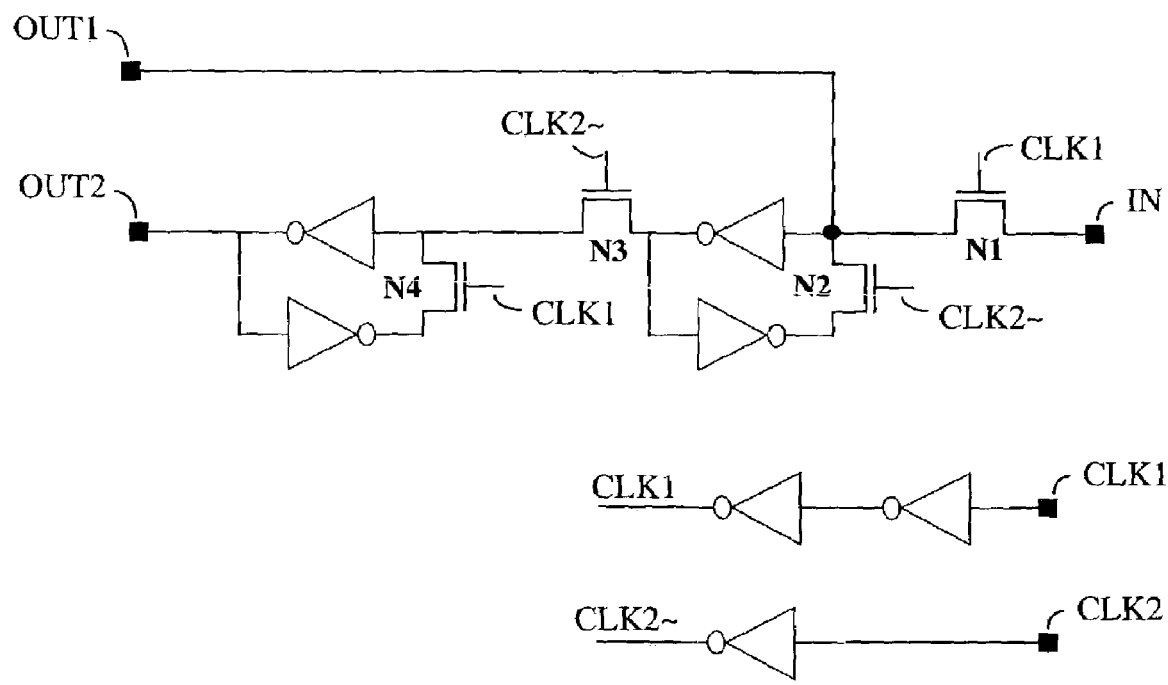
FIG. 3b) shows the details of the flip-flops in each IOG according to an embodiment of the invention.

FIG. 3(b) shows the schematic of flip-flops used according to a preferred embodiment of the invention. The schematic is exactly same as any other flip-flop normally used. The only difference is two clock input pins CLK1 and CLK2. CLK1 is buffered through two inverters and connected to the gates of pass transistors N1 and N4. CLK2 is first inverted to get CLK2~ and then CLK2~ is connected to the gates of pass transistors N2 and N3. Pin IN is the input of the flip-flop and pin OUT1 and OUT2 are two outputs of the flip-flop. OUT2 is the normal output of the flip-flop (registered output) and OUT1 is a tapping to get a latched output.

It can be seen that when CB1 (FIG. 3(a)) is 'zero', both nets CLK1 an CLK2~ have 'one'. This makes all the pass transistors N1, N2, N3, N4 ON making the flip-flop a simple latch. When CB1 is 'one' net CLK1 is driven by clock from pin CLK and net CLK2~ is driven by inverse of clock from pin CLK, making the flip-flop to operate normally.

It should be noted that FIG. 3(b) shows the schematic of a simple flip-flop, but it can be modified accordingly to add set, reset, or other features.

Figure 4:
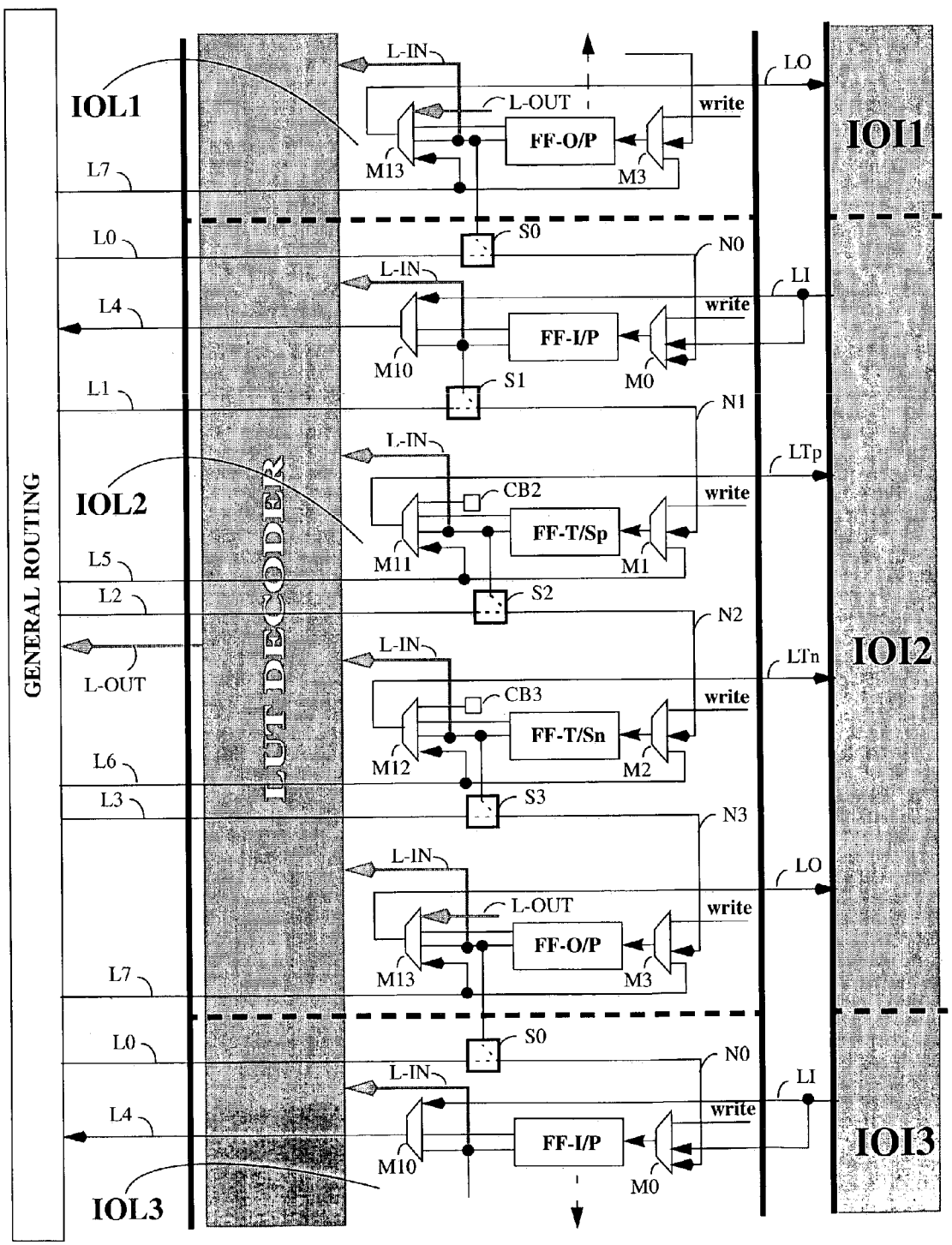
FIG. 4 shows the internal structure of an IO Logic Block (IOL) according to an embodiment of the invention.

FIG. 4 shows the detailed structure of a single IOL and its interface with IOI, GENERAL ROUTING and adjacent IOLs. In the figure IOL2 is referred for explanation.

Lines LI, LTp, LTn and LO interface IOL2 with IOI2. Lines L0 to L7 and L-OUT interface IOL2 to GENERAL ROUTING (note that IOL1 and IOL3 also have lines and devices with names common to IOL2, this is because here all the IOLs have exactly the same structure). Line L-OUT is the output of the LUT-DECODER, which goes to the GENERAL ROUTING. A tapping from line L-OUT also goes to mux M13. This allows LUT's output to be configured to go to the IO pad. Each of the four flip-flops FF-I/P, FF-T/Sp, FF-T/Sn and FF-O/P in IOL2 has one input and two outputs, one of which is to get latched output and other is for flip-flopped output. The input to the flip-flop FF-I/P can be configured through mux M0 to come from either of the lines N0, LI or write. Similarly input to the flip-flop FF-T/Sp can be configured through mux M1 to come from either of the lines N1, L5 or write, for flip-flop FF-T/Sn through mux M2 to come from either of the lines N2, L6 or write and for flip-flop FF-O/P through mux M3 to come from either of the lines N3, L7 or write. Both the outputs of the flip-flops FF-I/P, FF-T/Sp, FF-T/Sn and FF-O/P goes to the muxes M10, M11, M12 and M13 respectively. Mux M10 selects outputs of flip-flop FF-I/P or line LI (LI is signal line from pad through input buffer) to connect to line L4. Mux M11 selects outputs of flip-flop FF-T/Sp, configuration bit CB2 or line L5 to connect to line LTp (LTp is pull-up tri-state signal). Similarly mux M12 selects outputs of flip-flop FF-T/Sn, configuration bit CB3 or line L6 to connect to line LTn (LTn is pull-down tri-state signal) and mux M13 selects outputs of flip-flop FF-O/P, line L-OUT or line L7 to connect to line LO (LO is signal line going to pad).

A tapping from flip-flopped output of the flip-flops FF-I/P, FF-T/Sp, FF-T/Sn and FF-O/P goes to the configurable switch boxes S1, S2, S3 and S0 respectively. Note that switch box S0 of IOL2 is connected to the output of flip-flop FF-O/P of IOL1 and output of flip-flop FF-O/P of IOL2 goes to switch box S0 of IOL3. Switch box S1 can be configured to connect line N1 to line L1 and/or line N1 to output of flip-flop FF-I/P. Similarly other Switch boxes S0, S2, S3 can be configured.

A tapping L-IN from the flip-flopped output of all the flip-flops also goes to the LUT-DECODER.

As stated above, in a preferred embodiment, the structure of all IOLs is exactly same as that of IOL2.

Figure 5:
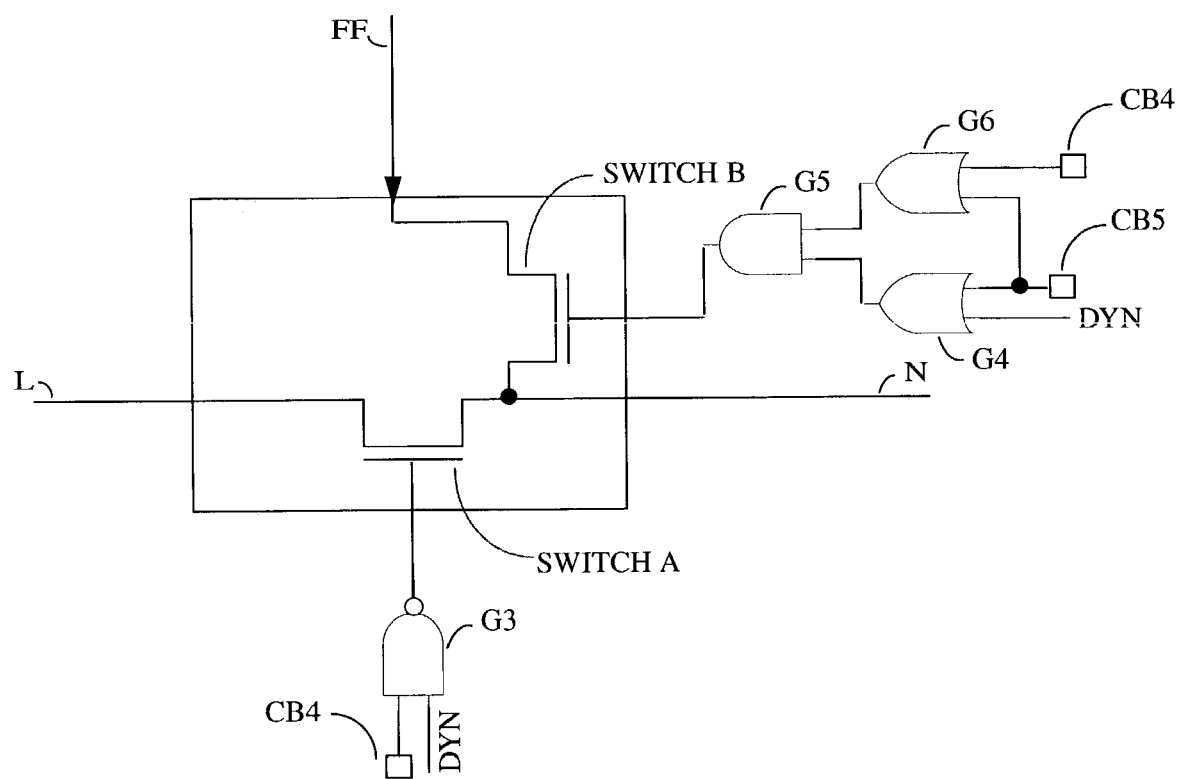
FIG. 5 shows the structure of the switch boxes inside the IOL according to an embodiment of the invention.

FIG. 5 shows the structure of switch boxes S0-S3. Each switch box has two NMOSs used as switches SWITCH A and SWITCH B. SWITCH A defines the connectivity of line L to line N and switch SWITCH B defines the connectivity of line FF (flip-flop output) to line N.

SWITCH A is controlled through a NAND gate G3. It can be configured by configuration bit CB4, to be permanently ON or controlled by a dynamic control signal DYN. Signal DYN can be generated within the core. Similarly SWITCH B is controlled through cascaded OR-AND gates G4, G5 and G6. It can be configured by same configuration bit CB4 and configuration bit CB5, to be permanently ON, permanently OFF or controlled by a dynamic control signal DYN.

Table below is the truth table of states of both the switches with respect to configuration bits CB4 and CB5 status.

TABLE 1

Truth table of states of switched with respect to configuration bits

| CB4 | CB5 | SWITCH A | SWITCH B |
|---|---|---|---|
| 0 | 0 | ON | OFF |
| 0 | 1 | ON | ON |
| 1 | 0 | Controlled by DYN bar | Controlled by DYN |
| 1 | 1 | Controlled by DYN bar | ON |

Figure 6:
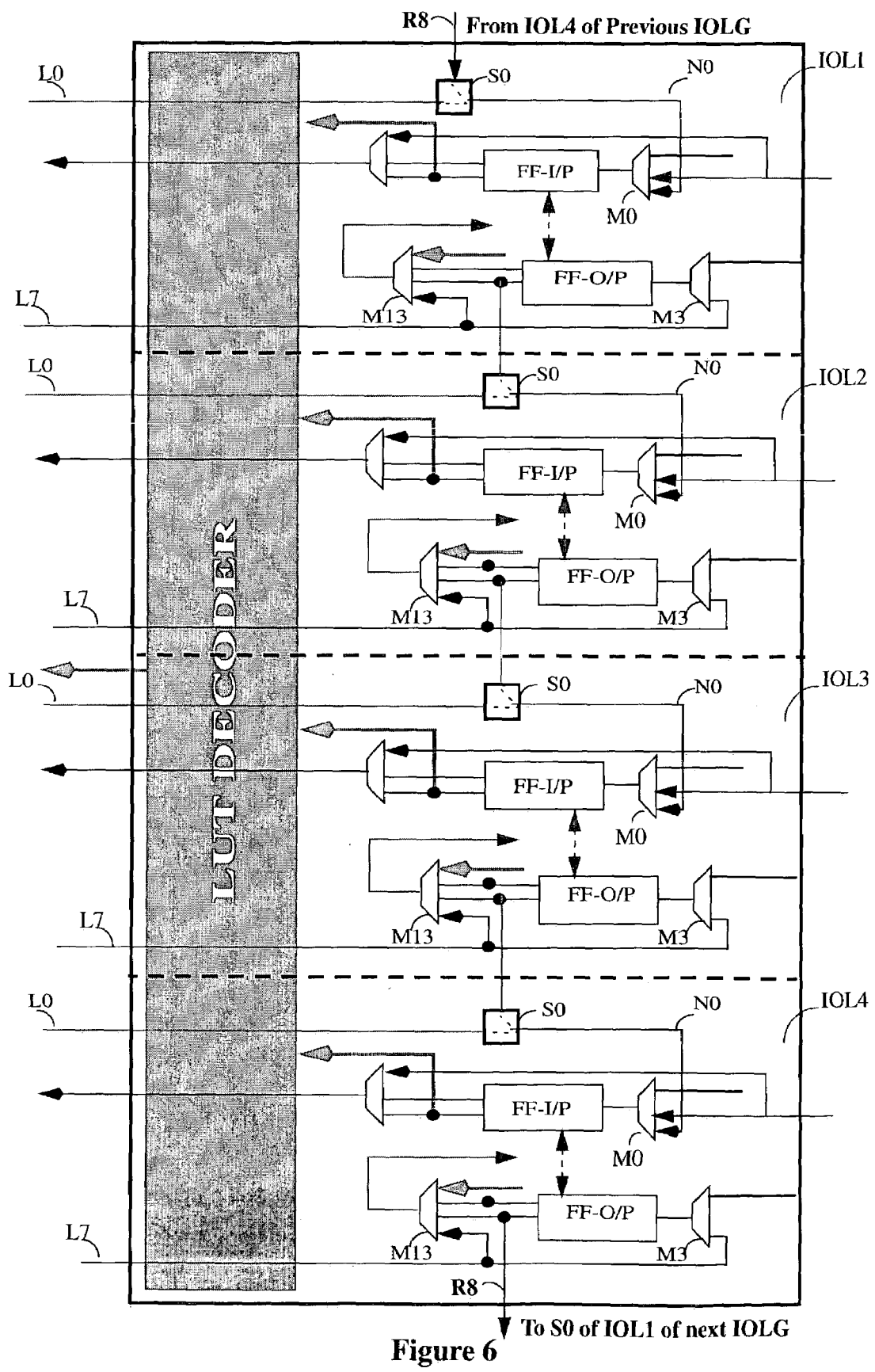
FIG. 6 shows the interconnection of 4 IOLs according to an embodiment of the invention.

FIG. 6 shows the connectivity of four IOLs namely IOL1, IOL2, IOL3 and IOL4 in an IOLG. For each IOL only the circuitry which is needed to explain its interfacing with the neighboring IOLs is shown. Route R8 in IOL1 connects it to IOL4 of the previous IOLG and route R8 in IOL4 connects it to IOL1 of the next IOLG. Route R8 in IOL1 is linked with switch box S0 of IOL1. This switchbox can be configured in a way so as to take the signal R8 to FF-I/P through mux M0. The output of flip-flop FF-O/P of IOL1 goes to one of the inputs of S0 of IOL2. In the similar way all the IOLs in an IOLG can be interfaced with their neighboring IOLs. Also the first IOL of an IOLG can be connected to the last IOL of its previous IOLG and the last IOL of an IOLG can be connected to the first IOL of its next IOLG.

Figure 7:
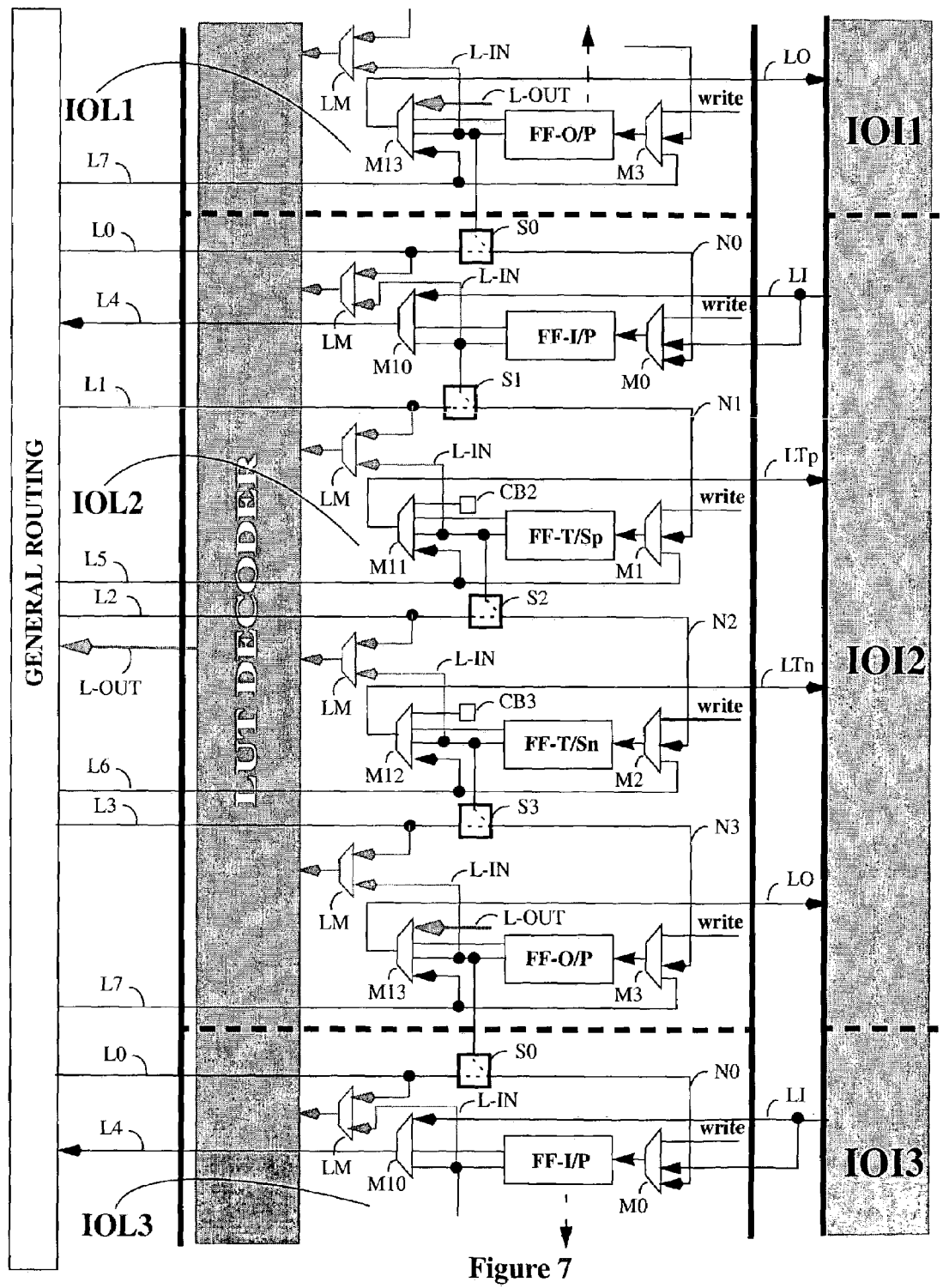
FIG. 7 shows another embodiment of the invention relating to unused LUT decoders.

FIG. 7 shows another embodiment of the present invention. The only additions in this embodiment are 16 two-input LM muxes. Now the LUT-DECODER has its input coming from these 16 muxes instead of directly form flip-flops' output. One of the inputs to the LM muxes comes from the flip-flopped output of the flip-flops and the other comes from the lines L0–L3. So the LM muxes provides the option to select the 16 inputs to the LUT-DECODER to either come directly from core or from flip-flops. This option makes the LUT-DECODER to be used as 16-input multiplexer when not used for LUT.

Description of Operating Modes

The operation of the above-preferred embodiment of the invention will now be described for various modes of operation.

The following text describes the configuration of IOG for various modes of operation.

Normal Operation Mode

IOLs can be configured, independent of each other, for normal operation. In normal operation mode, IOL can be configured to provide direct, registered or latched input data from the input buffer to the core and also to provide direct, registered or latched output data and tri-state signals from the core to the output buffer.

Referring to FIG. 4, to provide direct input to the core, line LI coming from the input buffer BUFIN is selected by mux M10 to connect to the line L4 (BUFIN and BUFOUT are defined in FIG. 3a). To provide registered or latched input to the core, line LI is selected by mux M0 as input to the flip-flop FF-I/P. One of the two outputs of this flip-flop can be selected by mux M10 to connect to the line L4, depending upon the type of input required, registered or latched.

Similarly, to provide data coming from the core directly to the output buffer BUFOUT, line L7 coming form the core is selected by mux M13 to connect to the line LO. To register and latch the core data, line L7 is selected by mux M3 as input to flip-flop FF-O/P. One of the two outputs of this flip-flop can be selected by mux M13 to connect to the line LO, depending upon the type of output required, registered or latched. Tri-state signals to the output buffer BUFOUT can also be configured as direct, registered, latched or permanent (permanent is when coming from a configuration bit). The configuration bits CB2 and CB3 can be connected to tri-state signals LTp and LTn through mux M11 and M12 respectively. Through this option the output buffer can be kept permanently enabled or tri-stated depending upon the configuration bits CB2 and CB3. For open drain output, only the pull-up transistor is permanently tri-stated through line LTp and configuration bit CB2. Alternatively, only the pull-down transistor is permanently tri-stated through line LTn and configuration bit CB3. Both the tri-state lines LTp and LTn can also be configured independently to have direct, registered or latched signals. To provide a signal coming from the core directly to the pull-up tri-state line LTp, line L5 is selected by mux M11 to connect to line LTp. To register and latch the signal, line L5 is selected by mux M1 as input to flip-flop FF-T/Sp. One of the two outputs of this flip-flop can be selected by mux M11 to connect to the line LTp, depending upon the type of pull-up tri-state signal required, registered or latched. Similarly pull-down tri-state line LTn can configured for these options by muxes M12 and M2, line L6 and flip-flop FF-T/Sn.

In summary, during Normal Operation, the core can get direct, registered or latched input data from the pad. A pad can have direct, registered or latched output data from the core. An output buffer can be configured to be permanently enabled, permanently tri-stated, dynamically tri-state controlled by core, pull-up open drain or pull-down open drain. The output buffer tri-state signals from the core can also be direct, registered or latched.

When input, output and tri-state signals of an IOL use direct signaling, then the four unused flip-flops can be used in other modes of operation.

Data Conversion Mode

In this mode the unused flip-flops of IOLs can be configured for parallel to serial or serial to parallel data conversion operations. A single IOL can be used as 4-bit data converter. For higher widths two or more IOLs can be cascaded. There are various ways of data conversion depending upon the requirement, as described below.

B1) Parallel To Serial Data Conversion

In this mode parallel data is converted into serial data using flip-flops in IOL of IOGs. The data converter can be of any width.

The different options in this mode are described below using the example of a 4*1 bit parallel to serial data converter:

B.1.1) Core-to-Core:

In this mode parallel data coming from the core is loaded into the flip-flops and then shifted serially to give serial output, which goes back to the core.

Referring to an IOL structure shown in FIG. 4, to operate in this mode SWITCH A and SWITCH B of switch boxes S1–S3 in a given IOL are configured to be dynamically controlled by signal DYN (structure of switch boxes is defined in FIG. 5). Switch box So of the same IOL has its SWITCH A permanently ON and SWITCH B permanently OFF and switch box S0 of the next IOL (i.e. IOL3 is next IOL to IOL2) has its SWITCH A permanently ON and SWITCH B also permanently ON.

In the beginning of this mode SWITCH A of switch box S0 is permanently ON and of switch boxes S1, S2 and S3 are kept in the ON state by signal DYN, thus connecting L0 to N0, L1 to N1, L2 to N2 and L3 to N3. Nets N0, N1, N2 and N3 are selected by multiplexers M0, M1, M2 and M3 respectively and fed to flip-flops FF-I/P, FF-T/Sp, FF-T/Sn and FF-O/P respectively, which loads the 4 bit data form the core parallely at the rising edge of the clock pulse (i.e. if the flip-flop is a positive edge triggered). After the parallel data is loaded, SWITCH A of switchboxes S1, S2 and S3 goes into OFF state and SWITCH B of switchboxes S1, S2 and S3 goes into ON state. As SWITCH A ad SWITCH B of switchbox S0 of next IOL are permanently ON, so with every clock edge the parallel data shifts serially through the flip-flops, getting serial output from L0 of next IOL in four clock pulses.

B.1.2) Core-to-PAD:

This mode is similar to the core-to-core mode, the only difference being the output destination, which in this mode will go to the IO pad. This is realized by programming mux M13 such that it selects the registered output of FF-O/P. Thus the serial output goes to line LO which goes to output buffer and then finally reaches PAD. Here S0 of next IOL is not used and its SWITCH B is kept permanently OFF.

The serial data output going to the pad in this mode can also be configured to go to the core depending upon the configuration of switch box S0 of next IOL. SWITCH A and SWITCH B of S0 are configured permanently ON and mux M13 is configured to select the registered output of FF-O/P for simultaneous serial data output to IO pad and core.

The advantage of parallel to serial core-to-pad data conversion mode is that it can be used to overcome the shortage of IO pins resources. It can reduce the number of output pins required by first converting the parallel data into serial data and sending it to only one of the output pins.

B.1.3) PAD-to-PAD:

In this mode the 4-bit parallel input data comes from external world using IO pins in the input mode, gets converted into serial data and the output is taken from a single output pin.

Referring to FIG. 2, four IO pads of IOG1 are configured to take 4-bit parallel input data. (for this configuration of IOG1 refer to FIG. 4, line LI of all the four IOLs is selected to connect to line L4). The 4-bit input data goes to the GENERAL ROUTING via routes R1. After reaching GENERAL ROUTING, the further operation becomes similar to the core-to-pad parallel to serial data converter. Any one of the IOLs of IOG2 or of any other IOG can be configured for data conversion.

B.1.4) PAD-to-Core:

In this mode the 4-bit parallel input data comes from external world using IO pins in the input mode, gets converted into serial data and the output goes to the core.

The operation of this mode is similar to the pad-to-pad case. Four-bit parallel input data is taken from four IO pads of IOG1 and goes to the GENERAL ROUTING via routes R1. Further operation is similar to the core-to-core parallel to serial data converter process.

B.2) Serial To Parallel Data Conversion

In this mode serial data is converted into parallel data using flip-flops in the IOL of the IOGs. The data converter can be of any width.

The different options in this mode are described below using the example of a 4*1 bit serial to parallel data converter.

B.2.1) Core-to-Core:

In this mode serial data coming from the core is loaded into the flip-flops and then taken out simultaneously to get parallel output, which goes back to the core.

Again referring to an IOL structure shown in FIG. 4, to operate in this mode SWITCH A of switch boxes S1–S3 in a given IOL are configured to be dynamically controlled by signal DYN.(Structure of switch boxes is defined in FIG. 5). SWITCH B of switch boxes S1–S3 are kept permanently ON. Switch box S0 of the same IOL has its SWITCH A permanently ON and SWITCH B permanently OFF and switch box S0 of the next IOL (i.e. IOL3 is next IOL to IOL2 ) has its SWITCH A dynamically controlled by signal DYN and SWITCH B.

On the commencement of this mode SWITCH A of switchbox S0 is in permanently ON state and SWITCH B of switchbox S0 is in permanently OFF state. SWITCH A of switchboxes S1, S2 & S3 are kept in OFF state by signal DYN and SWITCH B of switchboxes S1, S2 & S3 are permanently ON. Muxes M0, M1, M2 and M3 are programmed to select data on nets N0, N1, N2 and N3. The serial data coming from core through net L0 passes through S0 and M0 to reach FF-I/P. Output of FF-I/P is fed to FF-T/Sp through S1 and M1. Output of FF-T/Sp is fed to FF-T/Sn through S2 and M2. Output of FF-T/Sn is fed to FF-O/P through S3 and M3. And output of FF-O/P is fed to switchbox S0 of next IOL (IOL3 in case of IOL2 ). Thus the serial data coming from the core is loaded serially into flip-flops FFI/P FFT/Sp, FFT/Sn and FFO/P with every clock pulse. After 4 clock pulses the data gets loaded into the registers. Thereafter, SWITCH A of switch boxes S1, S2, S3 of the current IOL are turned ON by signal DYN. Also SWITCH A of S0 of the next IOL (IOL3) is turned ON by signal DYN and the 4 bit data is available parallely on nets L1, L2, L3 of the same IOL and L0 of next IOL (IOL3).

B.2.2) PAD-to-Core:

This mode is different in only one aspect with respect to core-to-core serial to parallel data converter mode. Mux M0 is programmed to select LI(LI is output of input buffer) instead of line N0, so that the serial input of data is taken from the IO pad instead of from the core.

Similar to parallel to serial core-to-pad data conversion mode, the advantage of this mode is that it can be used to overcome the shortage of IO pins resource. Instead of using a number of IO pins for parallel data input, it can reduce the number of input pins required by first accepting serial data form only one input pin and then converting the serial data into parallel data before sending it to the core.

B.2.3) Core-to-PAD:

This mode has two phases, the first being conversion of 4-bit serial data from the core to parallel data followed by transfer of this parallel data to output buffers. The first phase is the same as for core to core serial to parallel data conversion. In the second phase when data is available on nets L1, L2, L3 and L0 these are send to the GENERAL ROUTING matrix which routes it to any four IO pads operating in output mode and thus the data can be taken out parallely from different output pins.

B.2.4) PAD-to-PAD:

This mode also has two phases, in which the first is conversion of 4-bit serial data from the pad to parallel data and then giving this parallel data to the output buffers. The first phase is the same as for pad-to-core serial to parallel data conversion. In the second phase when data is available on nets L1, L2, L3 and L0 it is sent to the GENERAL ROUTING matrix which routes it to any four IO pads operating in output mode and thus the data can be taken out parallely from different output pins.

While the above description applies to 4*1 data conversion it is easily extendible to 4*2-bit data conversion, by cascading any two adjacent IOLs of the same IOG or even two adjacent IOLs of two adjacent IOGs, to get 8 flip-flops. The two IOLs can be configured as a 8 bit (i.e. 4*2 bit) data converter. (Connection between IOLs of same IOG and IOLs of different IOGs is defined in FIG. 6).

Similarly for 4*3-bit or 4*4-bit modes any three or four adjacent IOLs of an IOG or three or four adjacent IOLs of two adjacent IOGs can be cascaded to obtain 12-bit or 16-bit data converter. To have more than 4*4-bit data conversion, IOLs of adjacent IOGs can be cascaded.

It can be seen that in the proposed architecture all the flip-flops in the complete IO ring (all the IOGs) can be connected to each other in a sequence using switch boxes and muxes i.e. the output of the first flip-flop connected to the input of second, the output of the second flip-flop connected to the input of third, third to fourth and so on. In other words, this architecture enables data conversion of any number of bits.

The only requirement of the DATA CONVERSION mode is that to implement a data converter of 'X-bit', 'X' number of flip-flops in a sequence must be available. Also there must be a gap of at least one flip-flop between two separate data converters. For example, to implement two 4-bit data converters than there must be at least one flip-flop between these data converters, which is not utilized in data conversion (this flip-flop can be used in NORMAL mode).

DATA CONVERSION mode does not interrupt direct signaling of IO buffers in NORMAL mode as shown in the direct input case MUX M10 selects the direct input LI and the direct data is supplied to the core by line L4. In case of direct output muxes M11 and M12 select L5 and L6 lines for tristate signals and send these directly to IOI. Similarly mux M13 selects line L7 and connects it to the output buffer in IOI through line LO.

Lut Operation Mode

In this mode the complete IOLG can be configured to operate as a 4-input LUT, provided that all the 16 flip-flops in an IOLG are not used in any other mode. Direct signaling of IO buffers remains possible in this mode.

First referring to FIG. 3(a), all the 16 flip-flops in an IOLG are transparent latches at the time of configuration. As all the configuration bits are initialized to '0', setting configuration bit CB1 equal to '0' will make all the flip-flops independent of the clock behaving as simple latches. These latches are used as the storage elements of a LUT. On configuration the required data for logic implementation is first loaded into the latches and then configuration bit CB1 is changed to '1' causing all the 16 latches to change to flip-flops and become clock sensitive. However, the stored data does not change, as the inputs to the flip-flops are tri-stated.

These 16 latches have their outputs connected to LUT DECODER to form a 4-input LUT(connection of latches to LUT DECODER is defined in FIG. 4). Four inputs to the LUT can be configured through bus mux BM to come from GENERAL ROUTING via 4-bit bus R6 or from bus R7. R7 is a 4-bit bus coming from IO pads P1–P4 of the parent IOG through input buffers BUFIN. Similarly output of the LUT L-OUT can go to the core through GENERAL-ROUTING and/or to one, two, three or four of the four IO pads P1–P4 of the parent IOG through output buffers BUFOUT.

FIG. 4 shows the complete connectivity of all the components in an IOL. In IOL2 the write lines are LUT writing lines which at the time of configuration are used to load the required bits in the LUT storage cells. At the time of configuration these write lines are selected by muxes M0–M3 (because all the configuration bits are initialized to '0'). All the 16 flip-flops in an IOLG may be loaded in this way for configuring the LUT for the required four bit logic. Lines L-IN connect the output of the flip-flops to the LUT DECODER.

As explained earlier, the output of the LUT can be configured to go to the IO pads and/or to the core. Mux M13 of IOL2 selects connection of line L-OUT to output line LO for providing LUT output to pad P2. Similarly muxes M13 of IOL1, IOL3 and IOL4 can select line L-OUT to go to the IO pads P1, P3 and P4 directly. Also 4-inputs to the LUT can be configured to come from core or IO pads. In the case when the LUT has 4 inputs directly from the IO pads, these four inputs can also be passed to the core for some other logic operations. This option of direct signaling of LUT with IO pads, without going to the GENERAL ROUTING, reduces data delays.

It can be seen that in the LUT mode direct signaling of IO buffers in NORMAL mode is not interrupted. Line LI from BUFIN can be selected by mux M10 to go to the core through line L4. Similarly, lines L5, L6 and L7 coming from the core can be selected by muxes M11, M12 and M13 respectively to go to output buffer BUFOUT.

The requirement for operating in LUT mode is that the required number of flip-flops in an IOLG should be free.

For three variable functions only eight flip-flops will be required. Unused inputs can be tied to '1' or '0', as desired and the corresponding flip-flops can be used in NORMAL or DATA CONVERSION modes. These '0' and '1' can be generated within the core.

The proposed architecture can also be configured as a DYNAMIC LUT, that is for one clock period it implements a particular logic function of four variables and in another clock period it implements a different logic function of the same four variables by allowing the stored data to change dynamically with the clock. This can be done by connecting lines L0–L3 to lines N0–N3 through switch boxes S0–S3 and selecting lines N0–N3 by muxes M0–M3 as inputs to flip-flops, instead of write lines. Data on lines L0–L3 can be changed and loaded in the flip-flops with the clock pulse according to required logic. Data coming on lines L0–L3 can be generated within the core.

In another embodiment of the invention the LUT-DECODER circuitry is used as a multiplexer. Referring to FIG. 7 muxes LM can be configured to select lines L0–L3 coming from the core, to go to the LUT DECODER. The LUT DECODER can be used to multiplex these lines giving the multiplexed output at line L-OUT, which can be routed to core and/or IO pad. In this case there is no requirement to have free flip-flops, and they can be used in NORMAL mode (but not any other mode). The Multiplexer can also be 16, 8, 4 or 2 bit input in a manner similar to the LUT case, by supplying a permanent '0' or '1' to the select lines (called input lines in case of LUT).

What is claimed is:

1. In an FPGA apparatus, an improvement for enabling the selective utilization of unused flip-flops or other circuit elements in IO cells and unused decoders or other circuit elements in Look Up Tables (LUT), for core logic functions, comprising:

disconnecting means for selectively disconnecting unused circuit elements from the IO pad circuitry or from said LUT circuitry, and connecting means for selectively connecting said disconnected circuit elements either to the connection matrix of the core logic or between themselves to provide a LUT.

2. An FPGA apparatus as claimed in claim 1 wherein said disconnecting means is Configuration Logic circuitry provided between the internal core logic and IO pad interface circuits or LUTs.

3. An FPGA apparatus as claimed in claim 1 wherein said connecting means is a routing matrix between internal core logic and said IO pad circuitry or LUT circuitry.

4. An FPGA apparatus as claimed in claim 1 wherein said unused IO pad flip-flops are configured as serial-to-parallel or parallel-to-serial data converters.

5. An FPGA apparatus as claimed in claim 1 wherein said unused LUT circuit elements are deployed to implement configurable two or four input logic functions.

6. An FPGA apparatus as claimed in claim 5 wherein said logic function is a multiplexer function.

7. An FPGA apparatus as claimed in claim 1 including grouping of said IO pads for enabling configurable complex logic functions.

8. A method for enabling the utilization of unused flip-flops or other unused circuit elements in IO cells and unused decoders or other circuit elements in Look Up Tables (LUTs) of an FPGA for core logic functions, comprising the steps of:

disconnecting said unused circuit elements from said IO circuitry and/or LUT, and connecting said disconnected circuit elements to the connection matrix of the core logic or amongst themselves to provide a LUT.

9. A method as claimed in claim 8 wherein said disconnecting is done by Output Configuration Logic circuitry provided between the core logic and IO pad interface (IOL) circuits or LUT.

10. A method as claimed in claim 8 wherein said connecting is done by a routing matrix between interval core logic and said IO pad circuitry or LUT circuitry.

11. A method as claimed in claim 8 used for configuring said unused IO pads flip-flops as parallel-to-serial or serial-to-parallel data converter.

12. A method as claimed in claim 8 wherein said unused LUT circuit elements are deployed to implement configurable two or four input logic functions.

13. A method as claimed in claim 12 wherein said logic function is a multiplexer function.

14. A method as claimed in claim 8 including grouping of said IO pads for enabling configurable complex logic functions.

15. A field-programmable gate array, comprising:
an input-output pad;
a logic core;
a routing matrix coupled to the logic core; and
an input-output logic block coupled between the input-output pad and the routing matrix and operable to couple data between the input-output pad and the routing matrix and to perform a logical operation on data,
wherein inside the logic block includes a logic group, an interface group, and circuit elements providing a look-up table.

16. A field-programmable gate array, comprising:
an input-output pad;
a logic core; and
an input-output block coupled to the input-output pad and to the logic core and operable to couple data between the input-output pad and the core and to perform the logical operation on data while the block is disabled from coupling data between the input-output pad and the core, the logic block including circuit elements providing a look-up table.

17. The field-programmable gate array of claim 16 wherein only the circuit elements that are disabled from coupling data between the input-output pad and the core are operable to perform the logical operation on data.

18. The field-programmable gate array of claim 15 wherein the input-output block is operable to serially receive data from the input-output pad and to provide the received data to the core in parallel.

19. The field-programmable gate array of claim 15 wherein the input-output block is operable to receive data from the core in parallel and to serially provide the data to the input-output pad.

20. The field-programmable gate array of claim 15 wherein the input-output block is operable to serially receive data from the core and to provide the received data back to the core in parallel.

21. The field-programmable gate array of claim 15 wherein the input-output block is operable to receive data from the core in parallel and to serially provide the data back to the core.

22. The field-programmable gate array of claim 15 wherein the input-output logic block comprises a flip-flop.

23. A field-programmable gate array, comprising:
input-output pads;
a logic core;
input-output logic blocks each coupled to a respective one of the input-output pads and to the logic core and each operable to couple data between the respective input-output pad and the core and to perform a respective logical operation on data, each logic block including an input flip-flop element and an output flip-flop element, wherein an output of an output flip-flop associated with a first logic block is coupled, with no more than two delay elements interposed therebetween, to an input of an input flip-flop associated with a second logic block.

24. The field-programmable gate array of claim 23 wherein the logic core comprises a general routing network.

25. The field-programmable gate array of claim 23 wherein:
one of the input-output blocks is operable to serially receive data from the core and to provide the received data back to the core in parallel;
the core is operable to provide the received parallel data to a group of the input-output blocks; and
the group of input output blocks is operable to provide the received parallel data to the respective input-output pads in parallel.

26. The field-programmable gate array of claim 23 wherein:
a group of the input-output blocks is operable to receive in parallel data from the respective input-output pads and to provide the received data to the core in parallel;
the core is operable to provide the received data in parallel to an input-output block; and
the input-output block is operable to serially provide the data from the core on a respective input-output pad.

27. The field-programmable gate array of claim 23 wherein:
a group of the input-output blocks is operable to receive in parallel data from the respective input-output pads and to provide the received data to the core in parallel;
the core is operable to provide the received data in parallel to an input-output block; and
the input-output block is operable to serially provide the data back to the core.

28. A field-programmable gate array, comprising:
an input-output pad;
a logic core;
a routing matrix coupled to the logic core; and
an input-output logic block coupled to and separate from both the input-output pad and the routing matrix and operable to coupte data between the input-output pad and the routing matrix and to multiplex data, wherein inside the logic block includes a logic group, an interface group, and circuit elements providing a look-up table.

29. The field-programmable gate array of claim 28 wherein the input-output block is operable to receive data values from the core and to provide a selected one of the data values to the core.

30. The field-programmable gate array of claim 28 wherein the input-output block is operable to receive data values from the core and to provide a selected one of the data values to the input-output pad.

31. The field-programmable gate array of claim 28 wherein the input-output logic block is operable to store data values and to provide a selected one of the data values to the core.

32. The field-programmable gate array of claim 28 wherein the input-output logic block is operable to store data values and to provide a selected one of the data values to the input-output pad.

33. The field-programmable gate array of claim 28 wherein the input-output block is operable to receive data values and to provide a selected one of the data values in response to a selection signal from the core.

34. The field-programmable gate array of claim 28 wherein the input-output block is operable to receive data values and to provide a selected one of the data values in response to a selection signal from the input-output pad.

35. A method, comprising:
receiving data with an input-output logic block of a field-programmable gate array, the logic block coupled between an input-output pad and a routing matrix and wherein inside the logic block includes a logic group, an interface group, and circuit elements providing a look-up table, the routing matrix coupled to a logic core; and
performing on the data with the input-output logic block a logical operation other than coupling the data between the input-output pad and the routing matrix.

36. The method of claim 35, further comprising coupling data between the input-output pad and the logic core with the input-output logic block.

37. The method of claim 35 wherein the performing comprises:
serially receiving the data from the input-output pad; and
providing the received data to the logic core in parallel.

38. The method of claim 35 wherein the performing comprises:
receiving the data from the logic core in parallel; and
serially providing the received parallel data to the input-output pad.

39. The method of claim 35 wherein the performing comprises:
serially receiving the data from the logic core; and
providing the received data back to the logic core in parallel.

40. The method of claim 35 wherein the performing comprises:
receiving the data from the logic core in parallel; and
serially providing the received data back to the logic core.

41. A method, comprising:
receiving data with input-output logic blocks of a field-programmable gate array, each logic block including an input flip-flop element and an output flip-flop element, wherein an output of an output flip-flop associated with a first logic block is coupled, with no more than two delay elements interposed therebetween, to an input of an input flip-flop associated with a second logic block; and
performing on the data with the input-output logic blocks a logical operation other than coupling the data between an input-output pad and a logic core.

42. The method of claim 41 wherein:
the receiving comprises serially receiving the data from the logic core with one of the input-output blocks; and
the performing comprises,
providing the data in parallel from the one input-output block back to the core,
providing the data in parallel from the core to a group of the input-output blocks, and
providing the data in parallel from the group of input-output blocks to respective input-output pads.

43. The method of claim 41 wherein:
the receiving comprises receiving the data in parallel from input-output pads using a corresponding group of the input-output blocks; and
the performing comprises,
providing the data in parallel from the group of input-output blocks to the core,
providing the data in parallel from the core to an input-output block, and
providing the data serially from the input-output block to a corresponding input-output pad.

44. The method of claim 41 wherein:
the receiving comprises receiving the data in parallel from input-output pads using a corresponding group of the input-output blocks; and
the performing comprises,
providing the data in parallel from the group of input-output blocks to the core,
providing the data in parallel from the core to an input-output block, and
providing the data serially from the input-output block back to the core.

45. A method, comprising:
receiving data values with an input-output logic block of a field-programmable gate array, the logic block coupled between an input-output pad and a routing matrix that is also coupled to a logic core that is separate from the logic block, wherein inside the logic block includes a logic group, an interface group, and circuit elements providing a look-up table; and
selecting one of the data values with the input-output logic block.

46. The method of claim 45 wherein:
the receiving comprises receiving the data values from a logic core; and
the selecting comprises providing the selected one of the data values to the core.

47. The method of claim 45 wherein:
the receiving comprises receiving the data values from a logic core; and
the selecting comprises providing the selected one of the values to an input-output pad.

48. The method of claim 45, further comprising storing the data values in the input-output logic block before selecting one of the data values.

49. The method of claim 45, further comprising:
generating a selection signal with a logic core of the field-programmable gate array; and
wherein the selecting comprises selecting one of the data values in response to a selection signal.

50. The method of claim 45, further comprising:
receiving a selection signal on an input pad of the field-programmable gate array; and
wherein the selecting comprises selecting one of the data values in response to the selection signal.

* * * * *

UNITED STATES PATENT AND TRADEMARK OFFICE
CERTIFICATE OF CORRECTION

PATENT NO. : 7,157,936 B2
APPLICATION NO. : 10/347139
DATED : January 2, 2007
INVENTOR(S) : Rajat Chauhan et al.

It is certified that error appears in the above-identified patent and that said Letters Patent is hereby corrected as shown below:

In column 12, line 34, in Claim 1, delete "the" before "IO pad".

In column 12, line 37, in Claim 1, delete "the connection matrix" and insert -- a connection matrix --, therefor.

In column 12, lines 65-66, in Claim 8, delete "the connection matrix" and insert -- a connection matrix --, therefor.

In column 14, line 45, in Claim 28, delete "coupte" and insert -- couple --, therefor.

Signed and Sealed this

Thirtieth Day of September, 2008

JON W. DUDAS
*Director of the United States Patent and Trademark Office*